United States Patent [19]

Okumoto

[11] Patent Number: 5,305,518
[45] Date of Patent: Apr. 26, 1994

[54] WORK MOUNTING APPARATUS

[75] Inventor: Yutaka Okumoto, Tokyo, Japan

[73] Assignee: Japan Tobacco Inc., Tokyo, Japan

[21] Appl. No.: 950,884

[22] Filed: Sep. 25, 1992

[30] Foreign Application Priority Data

Sep. 26, 1991 [JP] Japan ................................. 3-248067

[51] Int. Cl.⁵ ............................................. B23P 19/04
[52] U.S. Cl. .................................... 29/822; 29/740; 29/743
[58] Field of Search ............... 29/739, 740, 741, 742, 29/743, 759, 760, 822, 721

[56] References Cited

U.S. PATENT DOCUMENTS

| | | | |
|---|---|---|---|
| 4,372,802 | 2/1983 | Harigane et al. | 29/743 X |
| 4,951,383 | 8/1990 | Amao et al. | 29/743 X |
| 5,033,185 | 7/1991 | Hidese | 29/743 X |

FOREIGN PATENT DOCUMENTS

| | | |
|---|---|---|
| 0315799 | 5/1989 | European Pat. Off. |
| 0401808 | 12/1990 | European Pat. Off. |
| 0449134 | 10/1991 | European Pat. Off. |
| 205500 | 8/1989 | Japan ................. 29/743 |
| 3203399 | 9/1991 | Japan ................. 29/743 |

*Primary Examiner*—Peter Dungba Vo
*Attorney, Agent, or Firm*—Oblon, Spivak, McClelland, Maier & Neustadt

[57] ABSTRACT

A work mounting apparatus according to the present invention comprises a rotating drum composed of separate upper and lower drums, a head unit arranged on the lower drum, a circular work head attached to the head unit and movable in the radial direction of the rotating drum, and a suction nozzle protruding from the outer peripheral surface of the work head toward a workbench. While the lower drum is rotating, the suction nozzle of the work head repeats cycloid motion along the workbench with its posture kept fixed with respect to the workbench. While repeating the cycloid motion, the nozzle receives a work from a work feeder of the workbench by suction, and mounts the work on a printed board on the workbench. The work mounting position on the printed board is determined by the cycle of the cycloid motion and by the distance of movement of the work head in the radial direction of the rotating drum.

12 Claims, 15 Drawing Sheets

| $K_{11}$ | — — — — — — — — — | $K_{1n}$ |
|---|---|---|
| $K_{21}$ | — — — — — — — — | $K_{2n}$ |
| | | |
| $K_{m1}$ | — — — — — — — — | $K_{mn}$ |

WORK MOUNTING APPARATUS

BACKGROUND OF THE INVENTION

1. Field of the Invention

The present invention relates to a work mounting apparatus for mounting an IC chip or some other electronic component, as a work, on a printed board.

2. Description of the Related Art

As one such work mounting apparatus, a continuous rotation-type apparatus is under development. This type of work mounting apparatus comprises a workbench having a work supply section and a work mounting section, a rotating drum which is continuously rotated, a large number of work heads protruding from the outer periphery of the rotating drum, and a suction nozzle protruding from the outer peripheral surface of each work head toward the workbench.

While the drum is rotating, the work head is turned about a turning axis extending in the radial direction of the drum, but its posture is held in a fixed posture during the turning motion. Namely, the suction nozzle is held in a position facing the workbench at all times despite the turn of the work head.

In this work mounting apparatus, when the work head is turning during the rotation of the drum, the suction nozzle of the work head makes cycloid motion, i.e., up-and-down motion with respect to the workbench. Thus, if the turning speed and turning direction of the work head are properly set with respect to the peripheral speed of the rotating drum, the speed of the suction nozzle of the work head relative to that of the supply and mounting sections can be made substantially zero when the nozzle is located closest to these sections. Accordingly, even while the drum is continuously rotated, if the timing for the supply and stoppage of a suction pressure with respect to the nozzle of the work head is properly controlled, the nozzle can reliably attract a work on the supply section and then mount the attracted work onto the printed board on the mounting section. Thus, the continuous-type work mounting apparatus permits continuous mounting of works on printed boards, whereby the mounting efficiency is greatly improved.

In the work mounting apparatus described above, when the turning speed of the work head is changed, the cycle of the cycloid motion of the suction nozzle also changes. Thus, by controlling the turning speed of the work head, the mounting position on the printed board at the mounting section, in which the work is to be mounted, can be shifted in the circumferential direction of the rotating drum. However, the mounting position cannot be shifted in the radial direction of the rotating drum.

When mounting works to an optional point on the printed board, therefore, the printed board must be placed, e.g., on an XY-table, so that it can be moved in the radial direction of the rotating drum by the XY-table.

If the XY-table is used, however, the work mounting efficiency is restricted by the actuating speed of the XY-table, and thus the rotational speed of the drum cannot be sufficiently increased. hindering improvement of the work mounting efficiency.

SUMMARY OF THE INVENTION

The object of the present invention is to provide a work mounting apparatus which does not require an XY-table, or if it is used, can reduce the operation frequency of the XY-table.

The above object is achieved by a work mounting apparatus according to the present invention, which comprises: a work supply section disposed in a predetermined transportation path and having a supply position to which works are successively supplied; a work mounting section disposed at a distance from the supply section, in the transportation path, and having a mounting surface on which the works are mounted; a carrier repeatedly movable along the transportation path between the mounting section and the supply section; a work head provided on the carrier, the work head having a turning axis extending across the transportation path and including an attraction rod projecting from the work head toward the transportation path; turning means for turning the work head around the turning axis while keeping the work head in a fixed posture with respect to the transportation path, during the movement of the carrier, and subjecting the distal end of the attraction rod to cycloid motion along the transportation path; means for supplying an attraction force to the rod; control means for controlling the cycle of the cycloid motion of the rod and the supply of the attraction force to the rod, the control means causing one of the works to be attracted to the distal end of the attraction rod in the supply position, and then releasing the work from the hold by the attraction rod at the mounting surface, so that the work is mounted on the mounting surface; and actuating means for moving the work head in a direction across the transportation path.

In the work mounting apparatus described above, when the carrier is moved along the transportation path, the work head is turned around the turning axis while being held in a fixed posture. The turning motion of the work head enables the attraction rod to make cycloid motion, and due to this cycloid motion, the attraction rod approaches one supply position or the mounting surface when the work head reaches the supply or mounting section, and at the same time, the speed of the attraction rod relative to that of the supply position and the mounting surface becomes zero. Thus, when the suction rod approaches the supply position, it is supplied with an attraction force such that a work at the supply position is attracted to and held by the rod. The work held by the attraction rod is then transported toward the mounting section as the carrier moves. When the attraction rod approaches the mounting surface, the supply of the attraction force to the rod is stopped, whereby the work is released from the attraction rod and mounted on the mounting surface.

The work mounting position on the mounting surface can be set to an optional position by controlling the cycle of the cycloid motion and the distance over which the work head is moved by the actuating means.

Thus, according to the work mounting apparatus of the present invention, even if an XY-table is not provided at the mounting section, works can be mounted to an optional position on the mounting surface. Consequently, the moving speed of the carrier can be increased without being restricted by the actuating speed of the XY-table, and the work mounting efficiency can be greatly improved.

The above and other objects, features, and advantages of the invention will be more apparent from the ensuing detailed description taken in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

Figure 1:
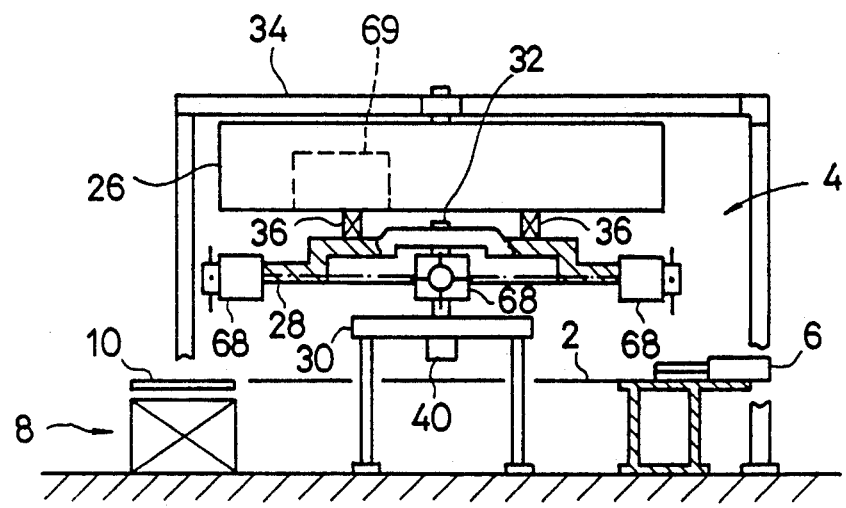
FIG. 1 is a schematic side view, partially in section, showing a chip mounter according to one embodiment of the present invention.
Figure 2:
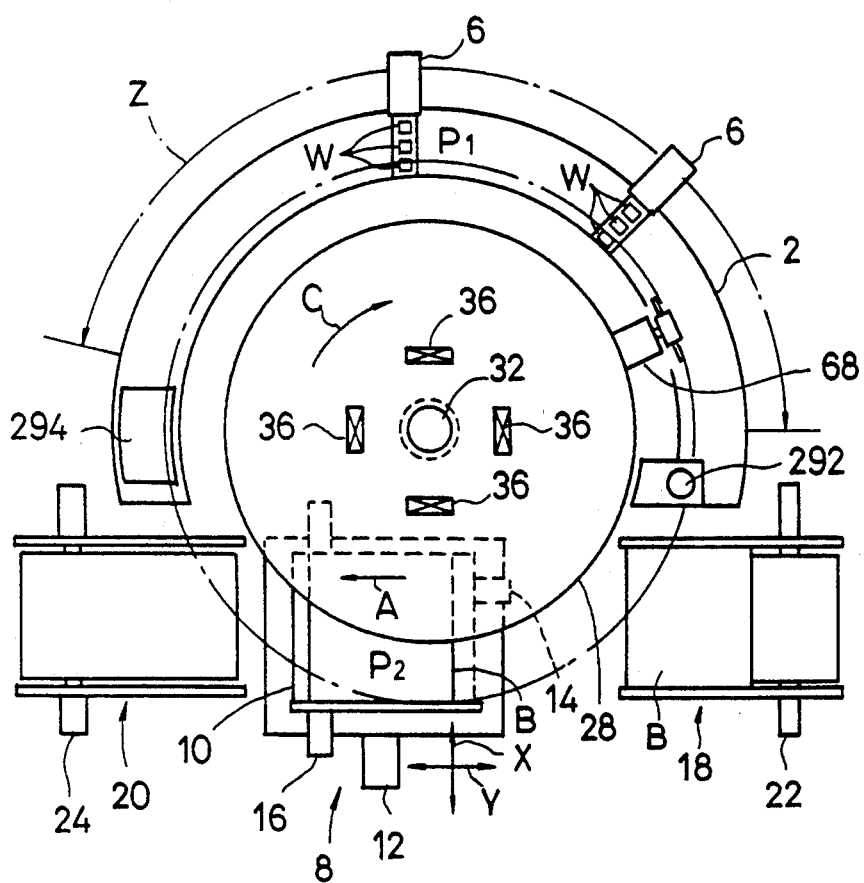
FIG. 2 is a schematic plan view showing the chip mounter of FIG. 1 with its upper drum omitted.

Referring now to FIGS. 1 and 2, there is shown an outline of a chip mounter. The chip mounter generally comprises a ring-shaped workbench 2 and a rotating drum 4 arranged over the workbench 2. The drum 4 is rotatable within a horizontal plane.

A large number of work feeders 6 are mounted in a radial shape on the workbench 2. These work feeders 6 can continuously feed various electronic components or works, such as IC chips, resistors, capacitors, etc., into a predetermined position on the workbench 2.

The work feeders 6 are arranged at regular intervals in the circumferential direction of the workbench 2, each feeder 6 constituting a work supply section. FIG. 2 shows only two of the work feeders 6 or supply sections.

As seen from FIG. 2, the workbench 2 is partially cut, and a mounting section is disposed in the cut region. The mounting section includes an XY-table 8, which has a table face 10. The table face 10 can be moved in the X-direction of FIG. 2 by means of an electric motor 12, and in the Y-direction by means of another electric motor 14. The Y-direction is perpendicular to the X-direction.

The table face 10 is defined by an endless belt, which is run in the A-direction of FIG. 2 by means of an electric motor 16. The A-direction is coincident with the Y-direction.

Conveyors 18 and 20 are arranged close to each other on the opposite sides of the table face 10, individually, with respect to the A-direction. Each of these conveyors 18 and 20, like the table face 10, includes an endless belt.

The table face 10 and the conveyors extend in alignment with one another, and the conveyors 18 and 20 can be run in the A-direction by means of electric motors 22 and 24, respectively.

A printed board B is fed onto the one conveyor 18. In FIG. 2, the printed board B is kept on stand-by on the conveyor 18. If the table face 10 is moved long in the Y-direction toward the conveyor 18, it is connected to the conveyor 18. When the conveyor 18 and the belt of the table face 10, in this state, are run together in the A-direction, the printed board B on the conveyor 18 is allowed to be transferred to the table face 10.

If the table face 10 is moved long in the Y-direction toward the conveyor 20, on the other hand, it is connected to the conveyor 20. When the table face 10 and the belt of the conveyor 20 are run together in the A-direction, in this case, the printed board B on the table face 10 is discharged onto the conveyor 20.

Thus, the one conveyor 18 has a function to carry in the printed board B onto the table face 10, while the other conveyor 20 has a function to carry out the printed board B from the table face 10.

A work supply position on the workbench 2, which is defined by each work feeder 6, and the printed board B on the table face 10 are on the same level. In FIG. 2, symbol Z designates a region in which the work feeders 6 can be set.

As shown in FIG. 1, the rotating drum 4 comprises an upper drum 26 and a lower drum 28 which are divided in the vertical direction. The lower drum 28 is rotatably supported on a drum base 30 by means of a drum shaft 32. The drum base 30 is located in the center of the workbench 2. The upper drum 26 is rotatably suspended from a frame 34, which surrounds the whole chip mounter. The upper and lower drums 26 and 28 are connected to each other by means of a plurality of couplers 36.

More specifically, the drum shaft 32 extends vertically through the center of the drum base 30, and a drive motor 40 is connected to the lower end of the shaft 32 by means of a speed reducer 38. The drive motor 40 is supported by the drum base 30. When the motor 40 is driven, the lower drum 28 is rotated in the direction of arrow C of FIG. 2 through the medium of the drum shaft 32. The rotatory force of the lower drum 28 is transmitted to the upper drum 26 through the couplers 36, so that the upper drum 26 is rotated integrally with the lower drum 28.

The lower drum 28 is provided with a large number of head units 68 which are used to take out works in the respective supply positions of the work feeders 6, and then mount them on the printed board B. These head units 68 are arranged at regular intervals in the circumferential direction of the lower drum 28.

The head units 68, which are shown only schematically in FIGS. 1 and 2, have the same construction and may be situated in a predetermined radial position with respect to the lower drum 28. The following is a description, therefore, of only one of the units 68.

Figure 3:
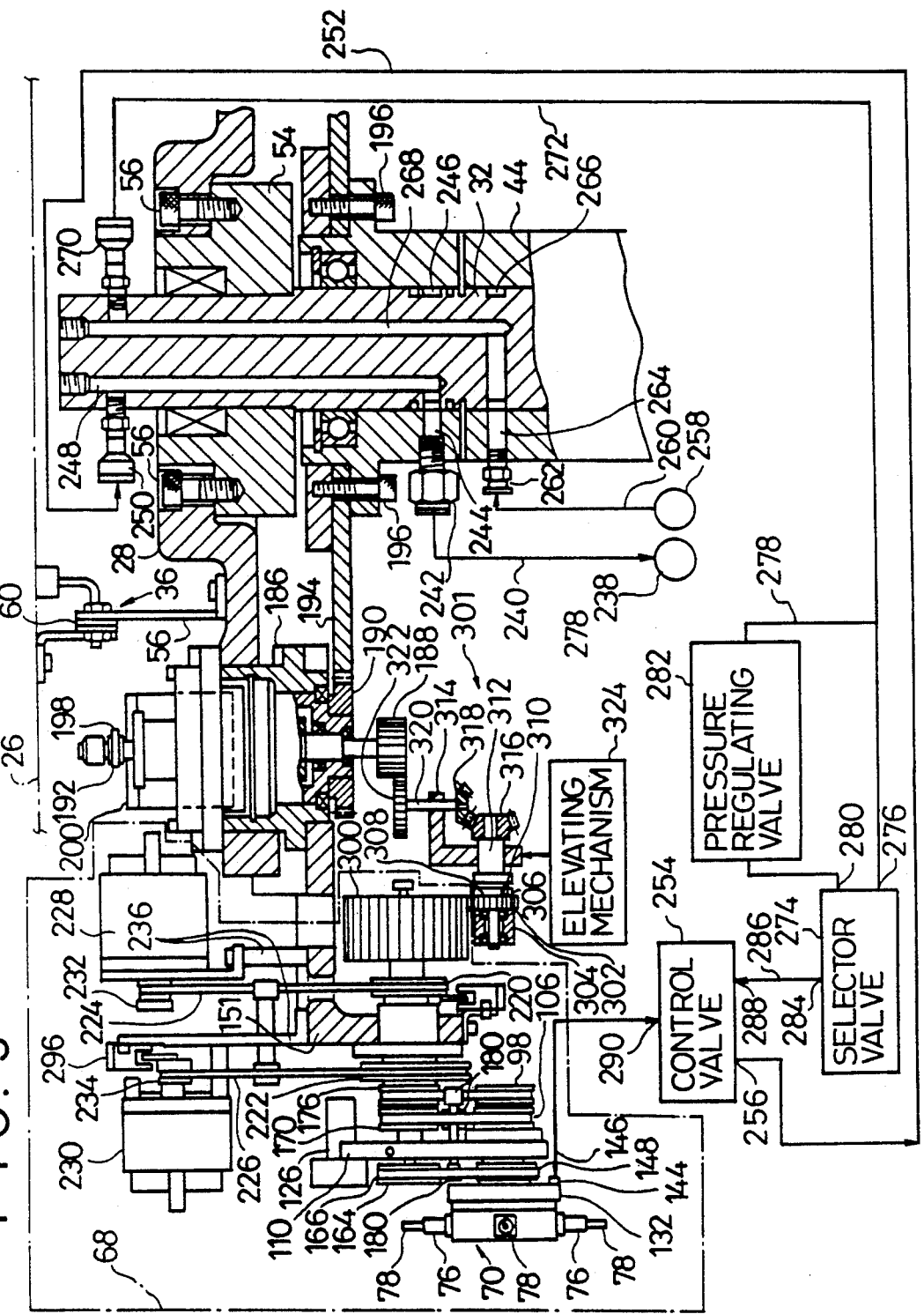
FIG. 3 is a sectional view showing a drive system in a lower drum, ranging from a drum shaft to a head unit.
Figure 4:
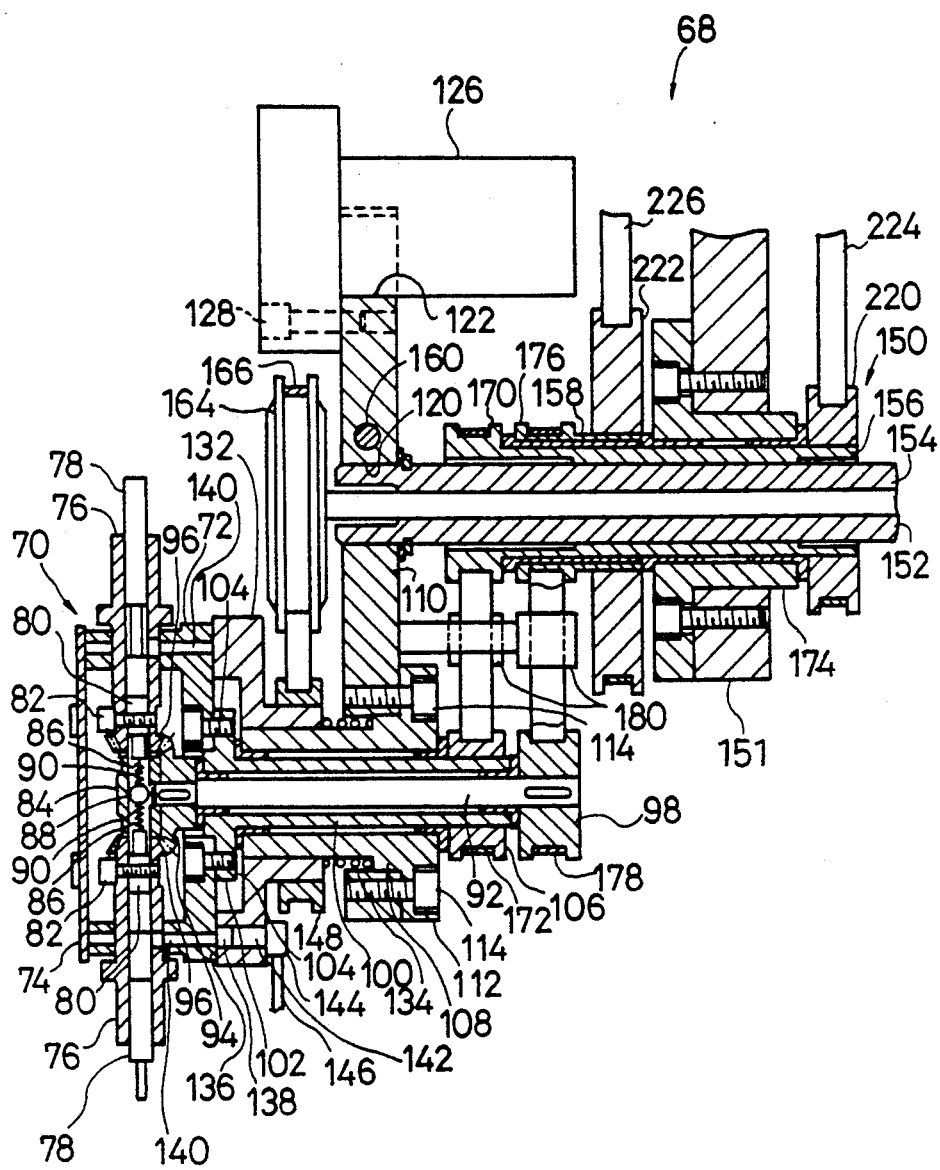
FIG. 4 is a sectional view showing the head unit in detail.

FIGS. 3 and 4 individually show in detail a specific arrangement of the head unit 68 and a drive system for the unit 68. Referring first to FIG. 4, the construction of the head unit 68 will be described.

The head unit 68 comprises a work head 70, which is positioned protruding from the outer peripheral edge of the lower drum 28. The head 70 includes a cylindrical head housing 72, whose axis extends in the radial direction of the lower drum 28. Thus, the head housing 72 has two opposite end faces which cross the radial direction of the lower drum 28 at right angles. The outer one of these end faces is open. This open end face is closed by means of a cover 74.

Four pipe-shaped nozzle holders 76 are provided on the peripheral wall of the head housing 72. These holders 76, which are arranged at regular intervals in the circumferential direction of the head housing 72, are attached to the housing 72 so as to penetrate the peripheral wall thereof. Further, the nozzle holders 76 are supported on the head housing 72 for rotation around their respective axes. Thus, the holders 76 protrude radially from the peripheral wall of the head housing 72.

A suction nozzle 78 is attached to each nozzle holder 76 so as to penetrate it. More specifically, an axial flattened portion 80 is formed in that part of the suction nozzle 78 which is situated in the nozzle holder 76, and a stopper bolt 82 is screwed into the holder 76 through the flattened portion 80 of the nozzle 78. Thus, the suction nozzle 78 can be rotated integrally with the nozzle holder 76 around its axis by means of the bolt 82. With respect to its axial direction, however, the nozzle 78 can move relatively to the holder 78 only for a distance corresponding to the length of the flattened portion 80.

The outer end of each suction nozzle 78 projects outward from the nozzle holder 76, and is provided with a suction port (not shown). The respective suction ports of the nozzles 78 are different in size from one another, depending on the sizes of the works to be attracted thereto.

A disk-shaped guide holder 84 is disposed in the central portion of the head housing 72. Guide holes 86 are formed radially in the peripheral surface of the guide holder 84, corresponding individually to the suction nozzles 78. Thus, the respective inner ends of the nozzles 78 projecting from the nozzle holders 76 are slidably fitted in their corresponding guide holes 86 of the guide holder 84. Further, the guide holder contains a ball 88, which is situated in the region where the guide holes 86 get together, and closes the respective inner ends of the holes 86. In each guide hole 86, a coil spring 90 is interposed between the inner end of the suction nozzle 78 and the ball 88. The spring 90 continually urges its corresponding nozzle 78 to the outside with respect to the radial direction of the work head 70, that is, in the direction to project from the head 70.

A first spindle 92 extends from the head housing 72 toward the lower drum 28. The axis of the spindle 92 is coaxial with the housing 72. One end of the spindle 92, which is situated in the head housing 72, supports the guide holder 84. A side gear 94, formed of a bevel gear, is mounted on one end portion of the first spindle 92 by means of a key. The diameter of the side gear 94 is greater than that of the guide holder 84. Each nozzle holder 76 has a pinion 96, in the form of a bevel gear, on its inner end. The pinions 96 are in mesh with the side gear 94.

Meanwhile, a toothed pulley or nozzle driving pulley 98 is mounted on the other end of the first spindle 92. When an external rotatory force is transmitted to the pulley 98, it is transmitted from the pulley 98 to the side gear 94 through the spindle 92. Then, the rotatory force is transmitted from the gear 94 to the individual nozzle holders 76 through the pinions 96. Thus, the holders 76 and their corresponding suction nozzles 78 are rotated around their respective axes.

A hollow second spindle 100 is coaxially fitted on the first spindle 92. Both ends of the second spindle 100 are rotatably supported on the first spindle 92 by means of a pair of bearings, individually. The second spindle 100 extends from the head housing 72 to the nozzle driving pulley 98. A flange 102 is formed on one end of the second spindle 100 which is situated on the side of the housing 72. The flange 102 is connected to the housing 72 by means of a plurality of connecting bolts 104. Thus, the head housing 72 can rotate together with the second spindle 100. A head driving pulley 106 formed of a toothed pulley is mounted on the other end of the second spindle 100. The pulley 106 is situated adjacent to the nozzle driving pulley 98. When an external rotatory force is transmitted to the pulley 106, the pulley 106 causes the head housing 72 to rotate through the medium of the second spindle 100. Thus, the second spindle 100 serves as the axis of rotation of the housing 72 or the work head 70.

Further, a hollow third spindle 108 is coaxially fitted on the second spindle 100. Both ends of the third spindle 108 are rotatably supported on the second spindle 100 by means of a pair of bearings, individually. The third spindle 108 extends from the flange 102 of the second spindle 100 to the head driving pulley 106.

A link arm 110, which extends from the third spindle 108, is connected integrally to the spindle 108. More specifically, a flange 112 is formed on that end portion of the third spindle 108 which is situated on the side of the head driving pulley 106. The flange 112 is connected to the link arm 110 by means of a plurality of connecting bolts 114.

Further, a center hole 120 is formed in the link arm 110, and a semicircular recess 122 is formed at the other end of the arm 110. The recess 122 and the center hole 120 are connected by means of a slit (not shown), and a notch groove in line with the slit 124 is formed on the inner peripheral surface of the hole 120.

A balance weight 126 is fitted in the recess 122 of the link arm 110. The weight 126 is fixed to the arm 110 by means of a plurality of connecting bolts 128.

The balance weight 126 is substantially as heavy as the head unit 68 which is connected to the one end of the link arm 110. Thus, the weights of the opposite sides of the link arm 110 are in equilibrium with the aforesaid hole 120 as the center.

A control disk 132 is rotatably mounted on the third spindle 108. The disk 132 has a stepped configuration, and its large-diameter portion is in engagement with the head housing 72. A hole is formed in the center of the end face of the large-diameter portion of the disk 132. This hole has a diameter greater than that of the flange 102 of the second spindle 100. Thus, the end face or ring-shaped end face 136 of the large-diameter portion of the control disk 132 can engage the head housing 72 without being hindered by the flange 102 of the second spindle 100.

A coil spring 134 is disposed between a small-diameter portion of the control disk 132 and a step on the third spindle 108 so as to surround the spindle 108. The spring 134 presses the ring-shaped end face 136 of the disk 132 against the head housing 72. Thus, the end face 136 and the end face of the housing 72 are airtightly in sliding contact with each other.

An arcuate groove 138, which is not shown in detail, is formed in the sliding-contact surface 136 of the control disk 132. On the other hand, a plurality of suction holes 140 open in the end face of the head housing 72. The respective openings of the holes 140 are arranged at regular intervals in the circumferential direction of the housing 72. Each suction hole, which is not shown in detail, continually communicates with its corresponding suction nozzle 78 by means of the nozzle holder 76.

In the state shown in FIG. 4, among the suction nozzles 78, the one whose distal end faces downward is connected to one end of the arcuate groove 138 of the control disk 132 through the suction hole 140 thereof. Even when the work head 70 is rotated for a predetermined rotational angle α (e.g., 45°) in one direction, the connection between the arcuate groove 138 and the suction hole 140 can be maintained. Therefore, the groove 138 has a length equivalent to the rotational angle α of the work head 70.

A control hole 142 is formed in the control disk 132. One end of the hole 142 is connected to the arcuate groove 138, and the other end thereof opens in that end face of the disk 132 on the opposite side to the sliding-contact surface 136. The opening of the control hole 142 is connected to a flexible tube 146 by means of a connecting plug 144. The tube 146 is connected to a suction circuit, which will be mentioned later. Thus, when a suction pressure from this suction circuit is supplied to the suction nozzle 78 through the tube 146, control hole 142, arcuate groove 138, and suction hole 140, the nozzle 78 is enabled to attract a work to its suction port.

A disk pulley 148 formed of a toothed pulley is mounted on the small-diameter portion of the control disk 132.

The head unit 68 is removably connected to the drive system on the side of the lower drum 28.

The drive system of the lower drum 28 comprises a shaft assembly 150, which extends in the radial direction of the drum 28. Part of the assembly 150 includes a quadruple-shaft portion, which is positioned projecting from the outer peripheral portion of the lower drum 28. Thus, the quadruple-shaft portion is situated in the vicinity of the head unit 68.

The shaft assembly 150 is supported on a movable support 151, which is movable on a rail (not shown) extending in the radial direction of the lower drum 28. Thus, the head unit 68 can be moved in the radial direction of the lower drum 28.

The quadruple-shaft portion of the shaft assembly 150 includes a fixed shaft 152 on the center side and first, second, and third sleeve shafts 154, 156 and 158 rotatably fitted on the shaft 152 in succession.

One end portion of the first sleeve shaft 154 projects outward from the second and third sleeve shafts 156 and 158 with respect to the radial direction of the lower drum 28. The link arm 110 of the head unit 68 is removably connected to this projecting end portion of the first sleeve shaft 154. More specifically, the one end portion of the first sleeve shaft 154 is fitted in the center hole 120 of the arm 110. A tapped hole which extends across the slit 124 is formed in a side face of the arm 110, and a connecting screw 160 is screwed in this hole. Since the screw 160 is thus screwed in, the center hole 120 of the link arm 110 is reduced in diameter. As a result, the connection between the link arm 110 and the first sleeve shaft 154 is established.

As seen from FIG. 3, the other end side of the first sleeve shaft 154 extends inward from the quadruple-shaft portion with respect to the radial direction of the lower drum 28. Namely, the other end side of the first sleeve shaft 154 penetrates the movable support 151 and extends inward with respect to the radial direction of the lower drum 28.

Further, both ends of the fixed shaft 152 extend penetrating the first sleeve shaft 154. More specifically, one end portion of the shaft 152 projects from the link arm 110, as shown in FIG. 4. A fixed pulley 164 formed of a toothed pulley is mounted on the one end of the fixed shaft 152 by means of a mounting bolt (not shown). A toothed belt 166 is passed around and between the pulley 164 and the disk pulley 148.

The other end of the shaft 152 is fixed to the movable support 151, though not illustrated in detail in the figure.

As shown in FIG. 4, the second sleeve shaft 156 has one end situated in the vicinity of the link arm 110, and extends inward for a predetermined length, with respect to the radial direction of the lower drum 28. The other end of the second sleeve shaft 156 penetrates the movable support 151. An output pulley 170 formed of a toothed pulley is provided on the one end of the second sleeve shaft 156. A toothed belt 172 is passed around and between the output pulley 170 and the head driving pulley 106. The other end portion of the second sleeve shaft 156 is rotatably supported by the movable support 151 through the medium of a bearing unit 174.

Further, the third sleeve shaft 158 extends between the output pulley 170 of the second sleeve shaft 156 and the bearing unit 174. An output pulley 176 formed of a toothed pulley is mounted on one end of the third sleeve shaft 158. A toothed belt 178 is passed around and between the output pulley 176 and the nozzle driving pulley 98.

A predetermined tension is applied to each of the three toothed belts 166, 172 and 178 by means of a plurality of tension rollers 180 shown in FIGS. 3 and 4. The tension rollers 180 are rotatably mounted on roller shafts which extend from the link arm 110.

The pulley ratio between each pulley of the shaft assembly 150 and its corresponding pulley of the head unit 68 is set at 1:1. Thus, even if the first sleeve shaft 154 is rotated by means of an external driving force when the respective output pulleys 170 and 176 on the second and third sleeve shafts 156 and 158, as well as the pulley 164 on the fixed shaft 152, are stopped from rotating, the head unit 68 rotates around the first sleeve shaft 154. At this time, the work head 70 is caused to turn around the first sleeve shaft 154 by the link arm 110, that is, the shaft 154 serves as a pivot of the head 70.

When the work head 70 turns in this manner, the toothed belts 166, 172 and 178, which are passed around and between the pulleys 148, 106, and 98 and their corresponding pulleys on the side of the shaft assembly 150, are restrained from rotating. In this case, therefore, the work head 70 keeps its posture fixed as it turns around the first sleeve shaft 154. Thus, the pulleys of the shaft assembly 150, pulleys of the head unit 68, and toothed belts constitute a planetary mechanism, which causes the work head 70 to turn while maintaining the posture of each suction nozzle 78 of the head 70. Accordingly, when one of the nozzles 78 of the head 70 faces downward, its downward posture can be maintained despite the turn of the work head 70.

Since the control disk 132 turns together with the work head 70 around the first sleeve shaft 154, these members can never rotate relatively to each other. Despite the turn of the disk 132 and the head 70, therefore, the arcuate groove 138 of the disk 132 and that suction hole 140 of the head housing 72 which is connected to the groove 138 can be kept connected to each other.

Referring now to FIG. 3, a power transmission path for the first sleeve shaft 154 will be described.

A large-sized gear 300 having a large face width or long teeth is mounted on the other end of the first sleeve shaft 154. The gear 300 is connected to an output gear 188 of a differential gear system 186 via a speed change mechanism 301. The output gear 188 is mounted on an output shaft of the system 186.

Figure 5:
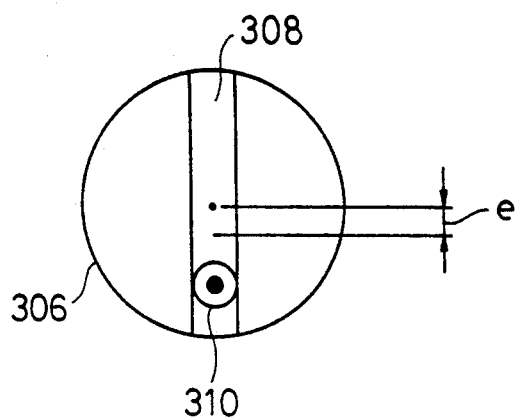
FIG. 5 is an end view of a disk in a speed change mechanism of the head unit.

The speed change mechanism 301 includes a pinion 302 meshed with the gear 300. The pinion 302 has a shaft thereof supported by the lower drum 28 via a bearing unit 304, though not illustrated in detail. A disk 306 is coaxially fixed to that end face of the pinion 302 which is located inward with respect to the radial direction of the lower drum 28. As shown in FIG. 5, the disk 306 has a guide groove 308 formed in an end face thereof and extending along the center thereof.

A roller 310 is movably fitted in the guide groove 308 of the disk 306. The shaft of the roller 310 extends from one end of a rotary shaft 312 eccentrically with respect to the axis of the shaft 312. The rotary shaft 312 rotatably extends through a support 314, and a bevel gear 316 is mounted on the other end of the rotary shaft 312.

The bevel gear 316 is in mesh with another bevel gear 318, which is mounted on one end or a lower end of a shaft 320. The shaft 320 rotatably extends through the support 314 toward the differential gear system 186. A pinion 322 is mounted on the other end of the shaft 320 and meshed with the output gear 188 of the differential gear system 186. The output gear 188 has a long teeth width than the pinion 322.

The support 314 is connected to an elevating mechanism 324 which has a function to raise and lower the support 314. Therefore, by moving the support 314 up or down by means of the elevating mechanism 324, a distance e of eccentricity (see FIG. 5) of the axis of the rotary shaft 312 with respect to the axis of the disk 306 or the pinion 302 can be adjusted. Even when the support 312 is moved up or down, the engagement between the output gear 188 of the differential gear system 186 and the pinion 322 is maintained.

As the rotatory force of the rotary shaft 312 is transmitted to the pinion 302 through the roller 310 and the disk 306, the pinion 302 is rotated. In this case, since the axis of the rotary shaft 312 is eccentric with respect to the axis of the pinion 302 as mentioned above, the roller 310 reciprocates along the guide groove 308 of the disk 306 during the rotation of the shaft 312. As a result, the rotational speed of the pinion 302 periodically changes with respect to the rotational speed of the rotary shaft 312, and the magnitude of the periodic change is determined by the distance e of the eccentricity mentioned above.

The periodic change of the rotational speed of the pinion 302 is transmitted to the work head 70 via the large-sized gear 300, first sleeve shaft 154 and link arm 110, and thus the rotational speed of the work head 70 also periodically changes. Accordingly, the periodic change of the rotational speed of the work head 70 also is determined by the distance e of eccentricity. When the distance e of eccentricity is zero, the pinion 302 and the rotary shaft 312 rotate at an equal speed.

The differential gear system 186, which is generally called a harmonic drive system, is fixedly mounted on the lower drum 28.

The differential gear system 186 includes an input pinion 190 and a toothed input pulley 192 on its input side. The input pinion 190 is in mesh with a ring gear 194, which is fixed, by means of a plurality of fixing bolts 196, to the fixed sleeve 44 which surrounds the drum shaft 32, as mentioned before.

The input pulley 192 is connected to an output pulley (not shown in detail) of a first control motor 200 by means of a toothed belt 198. The motor 200 is also supported by the lower drum 28.

As the lower drum 28 rotates, therefore, the differential gear system 186 receive an input from the input pinion 190, which is rotated by means of the ring gear 194, and also may receive an input from the input pulley 192, which is rotated by means of the first control motor 200.

When the lower drum 28 is first rotated by means of the drive motor 40 with the first control motor 200 off, the differential gear system 186 turns around the drum shaft 32. Accordingly, the input pinion 190 of the system 186 is rotated by means of the fixed ring gear 194. Since the rotatory force of the pinion 190 is transmitted to the first sleeve shaft 154 through the output bevel gear 188 of the differential gear system 186 and the bevel gear 184, the shaft 154 is also rotated. As a result, the work head 70 turns around the first sleeve shaft 154 in association with the rotation of the lower drum 28, while maintaining its posture, as mentioned before.

Figure 6:
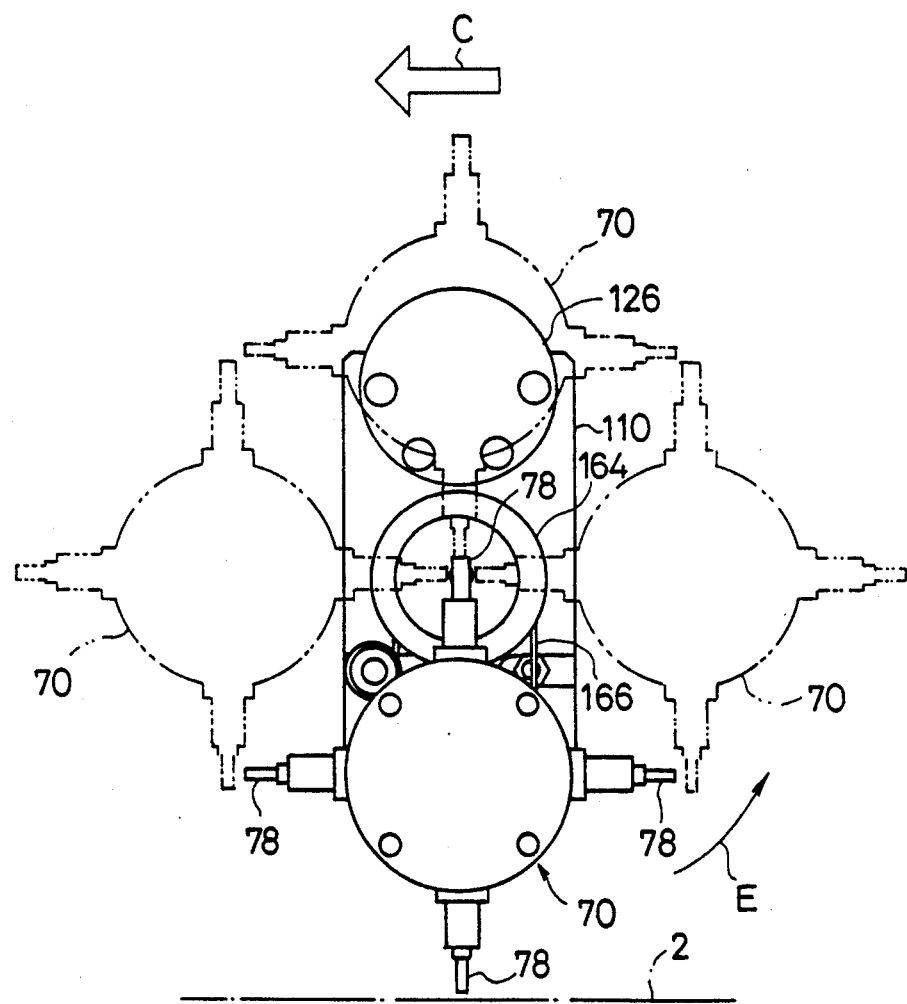
FIG. 6 is a front view showing a work head of the head unit.

The turning direction of the work head 70 is indicated by arrow E in FIG. 6, and the rotating direction of the lower drum 28 by arrow C. When the pivot of the head 70 or the first sleeve shaft 154 moves from right to left of FIG. 6 as the lower drum 28 rotates, the turning direction E of the head 70 is adjusted to the counterclockwise direction. When the work head 70 descends toward the workbench 2, therefore, the head 70 and the workbench 2 move in opposite directions.

If the workbench 2 is situated above the work head 70 as in FIG. 6, the turning direction of the head 70 is opposite to the direction E.

When the first control motor 200 is not driven, the power transmission system including the differential gear system 186 makes the peripheral speed of the lower drum 28 or the speed of revolution of the work head 70 around the drum shaft 32 equal to the turning speed of the head 70 or that of the distal end of each suction nozzle, to be exact.

Figure 7:
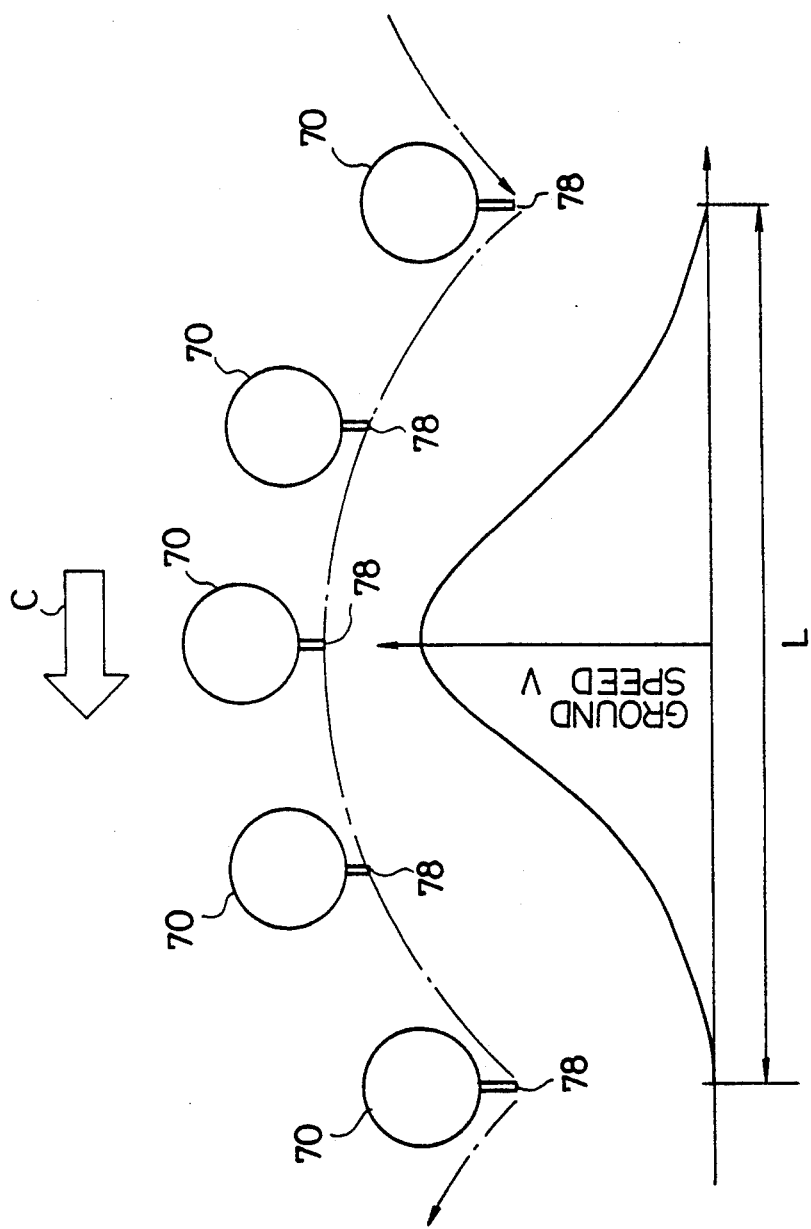
FIG. 7 is a schematic view illustrating the up-and-down motion of a suction nozzle of the work head.

When the rotation of the lower drum 28 and the turning motion of the work head 70 are concurrent, the head 70 repeats a cycloid motion, as shown in FIG. 7. More specifically, the downward suction nozzle 78 of the work head 70 moves so that its distal end generates a cycloid, and repeats up-and-down motion to approach and leave the workbench 2. FIG. 7 also shows change of the speed of movement of the suction nozzle 78 relative to the workbench 2, that is, ground speed V of the nozzle 78. The ground speed V is nearly zero when the suction nozzle 78 is situated in the lower limit position of its up-and-down motion, and is the highest when the nozzle 78 is in its upper motion limit position. The change of the ground speed V indicates the off-state of the first control motor 200.

If the first control motor 200 is driven so that the input pulley 192 of the differential gear system 186 is rotated while the lower drum 28 is rotating, however, the rotating speed of the output shaft or output bevel gear 188 of the system 186, that is, the turning speed of the work head 70, changes. By controlling the drive of the input pulley 192 or the first control motor 200, therefore, the turning speed of the head 70, that is, the cycle L of the cycloid motion of the downward suction nozzle 78, can be varied as required.

The following is a more specific description of the control of the cycloid motion of the work head 70.

Let it be supposed that the up-and-down motion of the head 70 is repeated N number of times if the work head 70 moves along a revolution path, which extends from the work feeder 6 in a position P1 in FIG. 2 to the table face 10 of the XY-table 8, that is, the printed board B, when the drive of the first control motor 200 is stopped. If the turning speed of the work head 70, that is, the cycle L of the cycloid motion thereof, in this state, is varied by the first control motor 200 through the medium of the differential gear system 186, the frequency of the up-and-down motion of the head 70 changes to N±x as the head 70 moves along the revolution path.

This indicates that the downward suction nozzle 78 of the work head 70 can descend to any desired position with respect to the circumferential direction of the workbench 2. Accordingly, the nozzle 78 of the head 70 can access not only any desired work feeder 6 on the workbench 2, but also any position on the revolution path which passes over the printed board B on the XY-table 8.

When the suction nozzle 78 descends toward the work feeder 6 or the printed board B, however, the control of the turning speed of the work head 70 is suspended. When the nozzle 78 reaches its lower motion limit position over the work feeder 6 or the printed board B, therefore, its ground speed V never fails to become zero.

As seen again from FIG. 4, toothed input pulleys 220 and 222 are mounted on the respective other ends of the second and third sleeve shafts 156 and 158, respectively. The pulleys 220 and 222 are connected to output pulleys 232 and 234, on the sides of second and third control motors 228 and 230, by means of toothed belts 224 and 226, respectively. As shown in FIG. 3, the motors 228 and 230 are mounted on the lower drum 28 by means of brackets 236, individually.

Thus, when the second and third control motors 228 and 230 are driven, the second and third sleeve shafts 156 and 158 are also rotated by means of their corresponding toothed belts. As mentioned before, the second sleeve shaft 156 and the second spindle 100 of the head unit 68 are connected to each other by means of the pulleys 170 and 106 and the belt 172. When the second sleeve shaft 156 is rotated, therefore, the second spindle 100 is also rotated, so that the work head 70 rotates on its own axis.

Further, the third sleeve shaft 158 and the first spindle 92 of the head unit 68 are connected by means of the pulleys 176 and 98 and the belt 178. When the third sleeve shaft 158 is rotated, therefore, the first spindle 92 is rotated, so that each suction nozzle 78, along with its corresponding nozzle holder 76, rotates around its axis, as mentioned before.

In this embodiment, the head unit 68, enclosed by the one-dot-chain line in FIG. 3, can be moved in the radial direction of the lower drum 28 by a drive mechanism (not shown) via the movable support 151. Even when the head unit 68 is moved, the engagement between the large-sized gear 300 and the pinion 302 is maintained.

The suction circuit shown in FIG. 3 is one used for one of the head units 68. The following is a description of this suction circuit.

The suction circuit comprises a vacuum pump 238. A connecting line 240 extends from the pump 238, and is connected to a radial hole 242 in the fixed sleeve 44 by means of a connector 242.

An annular groove 246 is formed on the outer peripheral surface of the drum shaft 32 in the fixing sleeve 44 so that it communicates with the radial hole 242 at all times. The groove 246 is connected to an internal passage 248 of the drum shaft 32, which axially extends in the shaft 32 to the upper end thereof. The upper end of the passage 248 is closed by means of a plug. The upper end portion of the passage 248 is connected to a connecting line 252 by means of a connector 250. The line 252, which extends toward the head unit 68, is connected to one port 256 of a control valve 254.

In the case of this embodiment, moreover, the suction circuit is provided with a pneumatic pressure source 258, which is connected to a radial hole 264 in the fixed sleeve 44 by means of a connecting line 260 and a connector 262.

An annular groove 266, which communicates with the radial hole 264 at all times, is formed on the outer peripheral surface of the drum shaft 32. The groove 266 is connected to an internal passage 268 of the shaft 32. The passage 268, like the aforesaid internal passage 248, extends to the upper end of the drum shaft 32, and its upper end is closed by means of a plug. The upper end portion of the passage 268 is connected to a connecting line 272 by means of a connector 270. The line 272, which extends toward the head unit 68, is connected to one input port 276 of a selector valve 274.

A line 278, which diverges from the middle of the connecting line 272, is connected to another input port 280 of the selector valve 274. A pressure regulating valve 282 is provided in the middle of the line 278.

An output port 284 of the selector valve 274 is connected to another port 288 of the control valve 254 by means of a connecting line 286.

Further, the control valve 254 is provided with still another port 290, besides the ports 256 and 288. The port 290 is connected to the connecting plug 144 of the head unit 68 by means of the tube 146.

The control valve 254 and the selector valve 274 are each formed of a solenoid-operated directional control valve of a three-port two-position type (not shown in detail). Thus, when the control valve 254 is in one shift position or suction position the port 290 of the valve 254 is connected to the first port 256. When the control valve 254 is shifted from the suction position to the other shift position or blow position, the port 290 is connected to the second port 288.

When the selector valve 274 is in one shift position or high-pressure position, the output port 284 of the valve 274 is connected to the one input port 276. When the valve 274 is shifted from the high-pressure position to the other shift position or low-pressure position, the output port 284 is connected to the other input port 280.

The pressure regulating valve 282 reduces a blow pressure supplied from the pneumatic pressure source 258 to a predetermined pressure level, and supplies it to the input port 280 of the selector valve 274.

The control valve 254, selector valve 274, and pressure regulating valve 282 are all fixedly arranged on the lower drum 28.

The connecting lines 240 and 260, which extend from the vacuum pump 238 and the pneumatic pressure source 258, respectively, are always connected to their corresponding connecting lines 252 and 272 through the internal passages 248 and 368 of the drum shaft 32, respectively, without regard to the rotation of the shaft 32.

Thus, when the control valve 254 is in the suction position, the tube 146 or the downward suction nozzle 78 of the work head 70 is connected to the connecting line 252 through the valve 254, and can be supplied with the suction pressure from the line 252. When the control valve 254 is shifted to the blow position, the suction nozzle 78 of the work head 70 is connected to the connecting line 272 through the valve 254, connecting line 286, and selector valve 274, and can be supplied with the blow pressure from the line 272. The blow pressure supplied to the nozzle 78 can be varied in two stages by changing the shift position of the selector valve 274.

An identification camera 292 is provided at one end of the workbench 2. As shown in FIG. 2, the camera 2 is located on the upper-course side of the XY-table 8 with respect to the rotating direction C of the lower drum 28. The camera 292, which is situated just below the surface level of the workbench 2, faces upward. Thus, when the work head 70 of the head unit 68 passes over the identification camera 292 as the lower drum 28 rotates, the camera 292 photographs the work attached to the downward suction nozzle 78 of the head 70. In this case, the nozzle 78 of the head 70 must be situated on its lowest level when it reaches the position nearest to the camera 292, that is, the position corresponding to the camera 292.

Thus, while the work head 70 is in turning motion as it revolves around the drum shaft 32, the downward suction nozzle 78 of the head 70 is situated on the lowest level when it reaches the position corresponding to the identification camera 292 and then a predetermined position or work mounting position P2 (see FIG. 2) on the printed board B on the XY-table 8. While the work head 70 moves from the location of the camera 292 to the mounting position P2, it makes an integral number of turns.

When the work head 70 moves from the location of the camera 292 to the mounting position P2, on the other hand, the toothed belt 172, which connects the output pulley 170 and the head driving pulley 106 of the head unit 68, travels for a distance equal to an integral multiple of its overall length. Thus, the state of engagement of the belt 172 with the pulleys 170 and 106 established when the location of the camera 292 is reached by the downward suction nozzle 78 of the work head 70 never fails to be reproduced when the mounting position P2 is reached by the nozzle 78.

As shown in FIG. 2, moreover, a work recovery container is arranged at the other end of the workbench 2 so as to be situated on the lower-course side of the XY-table 8 with respect to the rotating direction C of the lower drum 28. Only an opening 294 of the recovery container is shown in FIG. 2.

The first to third control motors 200, 228 and 230, the control valve 254 and the selector valve 274 of the suction circuit, the identification camera 292, rotary encoders designated by numeral 296 in FIG. 3, etc. are connected electrically to the controller 69 (see FIG. 1), which is housed in the upper drum 26. The controller 69 is also connected electrically to a computer (not shown). In this arrangement, the controller 69 receives an image signal from the camera 292, rotational angle signals from the rotary encoders 296, and a control signal from the computer, and controls the control motors 200, 228 and 230 and the valves 254 and 274 in accordance with these signals.

Referring additionally to FIGS. 8 to 13, the operation of the aforementioned chip mounter will now be described. In these drawings, subscripts a, b, c and d are affixed to reference numeral 78 which designates each suction nozzle of the work head 70. If the subscripts are thus affixed to numeral 78, it becomes evident that the posture of each nozzle 78 with respect to the workbench 2 makes no change even though the work head 70 is in turning motion.

Figure 8:
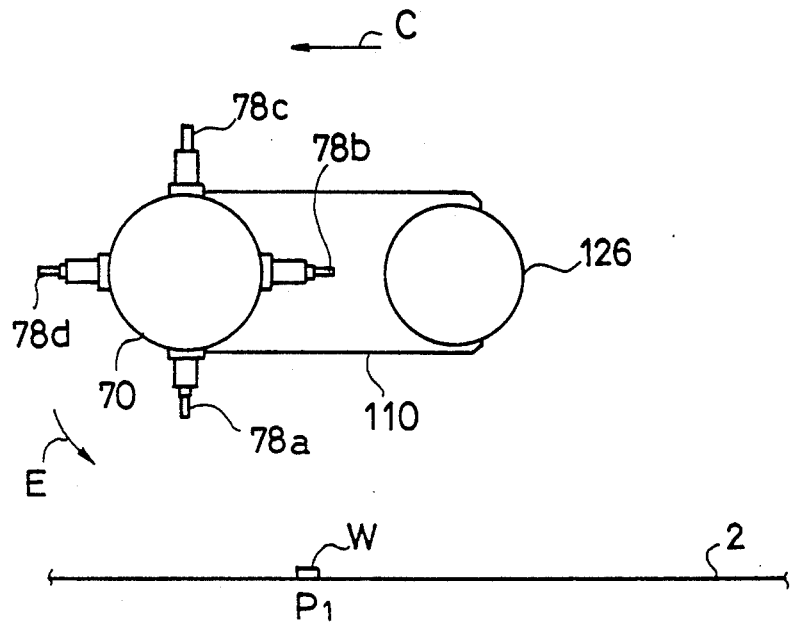
FIG. 8 is a front view showing the work head immediately before a work is attracted to a suction nozzle.

FIG. 8 shows a state in which the work head 70 is situated right over the work feeder 6 in the position P1 of FIG. 2 during the rotation of the lower drum 28. At this time, the work head 70 is turning toward the workbench 2, as indicated by arrow E, and the turning speed of the head 70 is equal to the peripheral speed of the lower drum 28, that is, the speed of revolution of the head itself.

In the state shown in FIG. 8, the controller 69 in the upper drum 26 shifts the control valve 274 of the suction circuit to the suction position, so that the suction pressure from the vacuum pump 238 is supplied to the downward suction nozzle 78a of the work head 70.

Figure 9:
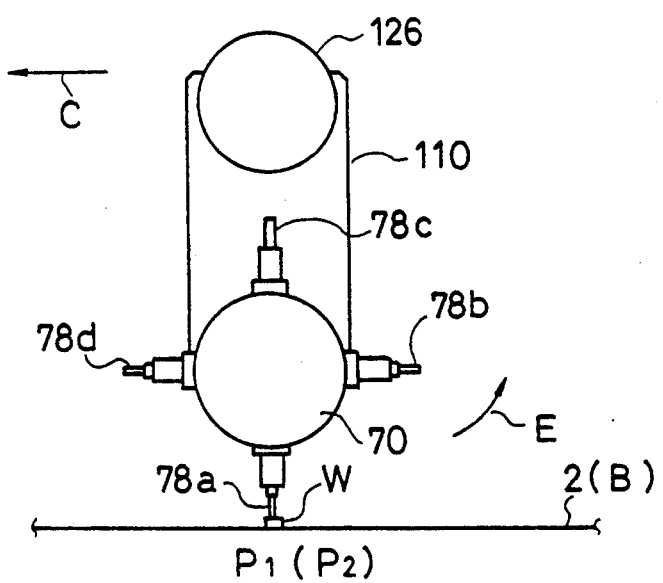
FIG. 9 is a front view showing the work head at the point of time when the work is attracted to the suction nozzle.

When the rotation of the lower drum 28 advances from the state of FIG. 8, thereafter, the suction nozzle 78a of the work head 70 further descends toward the position P1 on the workbench 2, and reaches the position of FIG. 9. In this state, the nozzle 78a of the head 70 is situated on the lowest level in the position P1. At this time, the speed of the nozzle 78a with respect to the workbench 2, that is, the ground speed V, becomes substantially zero, as mentioned before, so that the nozzle 78a can securely attracts thereto, by its suction pressure, the work W fed to the position P1 by the work feeder 6.

Figure 10:
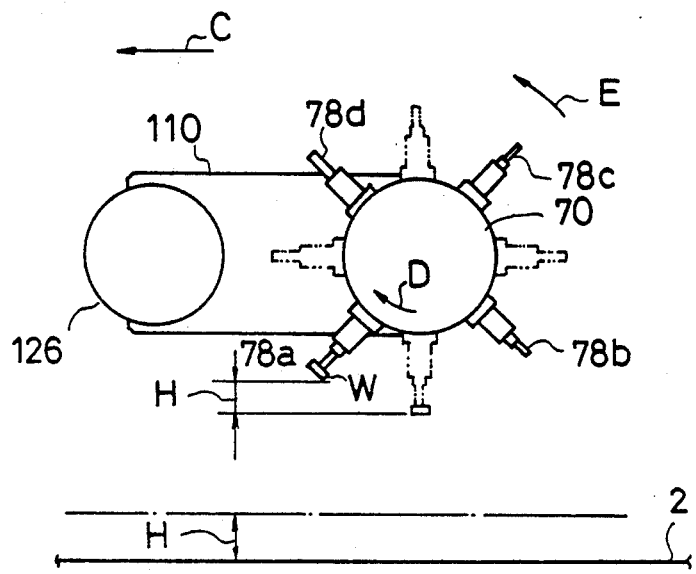
FIG. 10 is a front view showing the work head after the work is attracted to the suction nozzle.

When the rotation of the lower drum 28 and the turning motion of the work head 70 further advance, thereafter, the suction nozzle 78a turns in the direction to go away from the workbench 2 without leaving hold of the work W. At this time, the controller 69 executes drive control of the second control motor 228, that is, drives the motor 228. The driving force of the second control motor 228 is transmitted to the work head 70 through the toothed belt 224, input pulley 220, second sleeve shaft 156, output pulley 170, toothed belt 172, head driving pulley 106, and second spindle 100, and the head 70 rotates on its own axis for the aforesaid rotational angle α in the direction of arrow D, as shown in FIG. 10. As a result, the work head 70 assumes the rotational posture shown in FIG. 10.

Even though the work head 70 rotates on its own axis, the control hole 142 of the control disk 132 and one of the suction holes 140 of the work head 70 are kept connected to each other by means of the arcuate groove 138. Thus, the supply of the suction pressure to the suction nozzle 78a is continued, and the nozzle 78a keeps on holding the work W.

When the work head 70 rotates on its own axis in the aforesaid manner, the lower end of the suction nozzle 78a is raised by a height H, as shown in FIG. 10. After this, therefore, the nozzle 78a of the head 70 repeats its up-and-down motion within the region above the workbench 2 for the height H, at the least. Thus, when the work head 70 then passes over its adjoining work feeder 6, there is no possibility of the suction nozzle 78a interfering with the other work feeders on the workbench 2 or other mechanical members.

Figure 11:
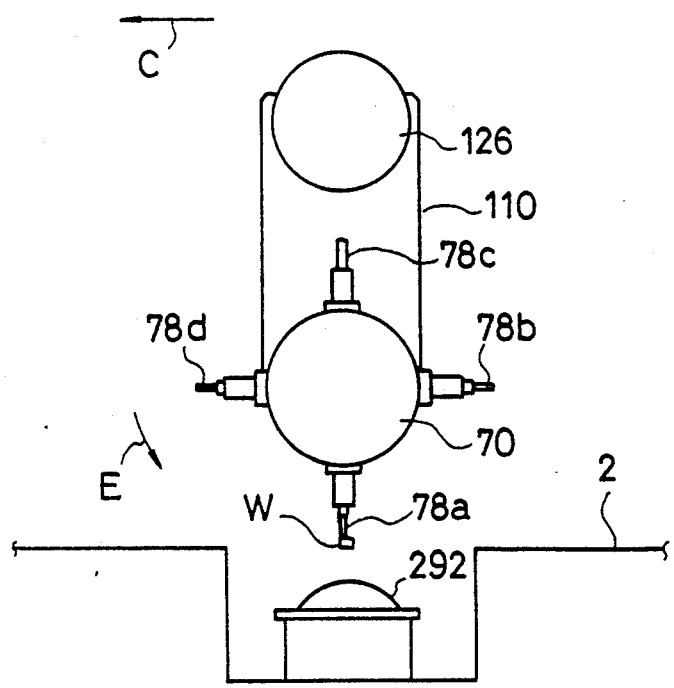
FIG. 11 is a front view showing the work head with the suction nozzle right over an identification camera.

When the rotation of the lower drum 28 further advances so that the work head 70 reaches the position just short of the identification camera 292, thereafter, the controller 69 drives the second control motor 228 to restore the head 70 to its original posture, whereupon the suction nozzle 78a of the head 70 faces downward again. Thus, when the nozzle 78a reaches its lowest position right over the camera 292, as shown in FIG. 11, the work W attached to the nozzle 78a faces the camera 292, whereupon the camera 292 photographs the work W. In this manner, the posture of the work W on the suction nozzle 78a can be clearly identified by means of the identification camera 292.

Image data on the work W, obtained by means of the identification camera 292, is supplied to the controller 69. Based on this image data, the controller 69 determines whether or not the work W is held in a right posture on the suction nozzle 78.

Figure 12:
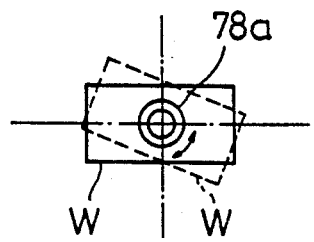
FIG. 12 is a view showing the posture of the work attached to the suction nozzle.

More specifically, the controller 69 determines whether or not the posture of the work W is deviated from vertical and horizontal reference lines shown in FIG. 12. If the posture of the work W is deviated from the reference lines beyond the tolerance limits, as indicated by broken line in FIG. 12, the controller 69 drives the third control motor 230, depending on the degree and direction of the deviation of the work posture. The driving force of the third control motor 230 is transmitted to the first spindle 92 through the toothed belt 266, input pulley 222, third sleeve shaft 158, output pulley 176, toothed belt 178, and nozzle driving pulley 98, and causes the spindle 92 to rotate. Since the rotatory force of the first spindle 92 is transmitted to the suction nozzle 78a through the side gear 94, pinion 96, and nozzle holder 76, the nozzle 78a is also rotated around its axis. Thereupon, the posture of the work W is corrected, as indicated by full line in FIG. 12.

As the lower drum 28 rotates, thereafter, the work head 70 moves toward the printed board B on the XY-table 8 while repeating the turning motion. When the suction nozzle 78a of the head 70 reaches the mounting position P2 on the printed board B, it is situated on the lowest level as in the case for the position P1. Accordingly, this state is identical with the one shown in FIG. 9, and the speed of the suction nozzle 78a relative to the printed board B is substantially zero.

The controller 69 executes shift control for the control valve 274 at a proper point of time immediately before the suction nozzle 78a reaches the mounting position P2. Thus, the control valve 274 is shifted from the suction position to the blow position. When the nozzle 78a reaches the mounting position P2, therefore, it releases its hold of the work W, and at the same time, securely mounts the work W in the mounting position P2 on the printed board B, with the aid of the blow pressure supplied from the pneumatic pressure source 258.

While the work W is mounted in this manner, the selector valve 274 is shifted to the low-pressure position by means of the controller 69, so that a low blow pressure is utilized for the work mounting.

If the posture of the work W is uncorrectable, the mounting operation for the work W is suspended. Thus, the suction nozzle 78a passes over the printed board B with the work W held thereon. Immediately before the nozzle 78a reaches the position over the opening 294 of the recovery container, thereafter, the controller 69 executes shift control for the control valve 254 and the selector valve 274. More specifically, at this point of time, the control valve 254 is shifted from the suction position to the blow position, while the selector valve 274 is shifted from the low-pressure position to the high-pressure position. Thus, the work W on the suction nozzle 78a is blown away toward the recovery container by means of a high blow pressure.

Thereafter, the work head 70 is changed to the posture shown in FIG. 10, and moved toward the target work feeder 6. Immediately before reaching this work feeder 6, the head 70 is restored to the posture shown in FIG. 8, and repeats the aforesaid operation.

When the work mounting described above is under way, the work head 70, i.e., the suction nozzle 78a, simply revolves along the same circumference, while repeating up-and-down motion. Therefore, the work mountable region on the printed board B is limited to the locus of the revolution.

Thus, in order to permit the work W to be mounted to a desired position on the printed board B, for example, the printed board B must be previously moved in the radial direction of the lower drum 28 by the XY-table 8 such that the desired work mounting position on the printed board B is situated on the locus of the revolution of the suction nozzle 78a. In this case, it is not necessary to set the mounting position with respect to the revolving direction of the suction nozzle 78a. Namely, the cycle L of the cycloid motion of the suction nozzle 78a can be varied as required through the drive control for the first control motor 200 as mentioned before, and therefore, the nozzle 78a never fails to mount the work W in the desired mounting position as long as the mounting position is situated on the locus of the revolution of the nozzle 78a.

In the case of the chip mounter of this embodiment, however, since the head unit 68, i.e., the work head 70, is movable in the radial direction of the lower drum 28 as mentioned before, the work W can be mounted to a desired mounting position on the printed board B without the need to actuate the XY-table 8. More specifically, if the work head 70 is moved in the radial direction of the lower drum 28, then the radius of the revolution of the suction nozzle 78a changes, so that an annular region R, hatched in FIG. 13, can be covered by the revolving suction nozzle 78a.

When the locus of revolution of the suction nozzle 78a is changed, the revolving speed of the work head 70 also changes. A change in the revolving speed gives rise to a relative speed between the printed board B and the suction nozzle 78a when the work W is mounted on the printed board B, but such a relative speed can be eliminated by the action of the speed change mechanism 301.

Specifically, if the distance e of eccentricity between the rotary shaft 312 and the pinion 302 is adjusted by the elevating mechanism 324 in accordance with a distance over which the work head 70 is moved in the radial direction of the lower drum 28, the turning speed of the work head 70 periodically changes as mentioned before. Thus, by suitably controlling the adjustment timing and magnitude of the eccentricity distance e, the relative speed between the printed board B and the suction nozzle 78a can be eliminated, making it possible to reliably mount the work W on the printed board B.

In the chip mounter according to the present invention, the suction nozzles 78a of the individual work heads 70 can attract and receive a work from the work feeder 6 situated in an optional position on the workbench 2 and mount the work to a desired position on the printed board B, without the need to stop the rotation of the lower drum 28.

Further, when mounting the work W, since the XY-table 8 need not be operated, the rotating speed of the lower drum 28 can be increased without being restricted by the operating speed of the XY-table 8, whereby the work mounting efficiency is greatly enhanced.

Figure 13:
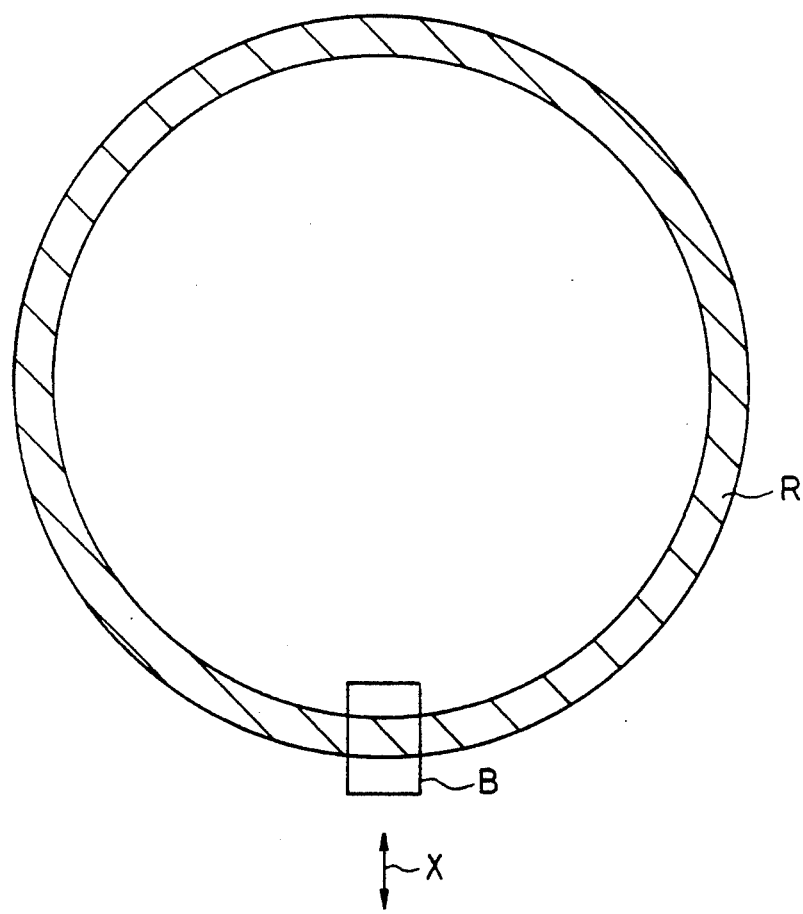
FIG. 13 is a diagram illustrating a region over which the work head is movable.

In the case where the size of the printed board B is too large to be covered by the distance over which the work head 70 can be moved in the radial direction of the lower drum 28, that is, the printed board B cannot be contained in the annular region R shown in FIG. 13, the XY-table 8 is moved to thereby move the printed board B only in the radial direction of the lower drum 28.

When the controller 69 is supplied with a command for the change of the suction nozzle 78, it drives the second control motor 228. The driving force of the motor 228 is transmitted to the work head 70 through the toothed belt 224, input pulley 220, second sleeve shaft 156, output pulley 170, toothed belt 172, head driving pulley 106, and second spindle 100, and the head 70 is caused to rotate on its own axis to the rotational angle position where the selected suction nozzle faces downward. In this case, therefore, the selected nozzle, like the aforesaid suction nozzle 78a, is connected to the control valve 254 by means of the arcuate groove 138 and the control hole 142 of the control disk 132.

It is to be understood that the present invention is not limited to the embodiment described above, and that various changes and modifications may be effected therein by one skilled in the art without departing from the scope or spirit of the invention.

Referring now to FIGS. 14 to 18, there is illustrated a chip mounter according to a second embodiment of the present invention. In the second embodiment, a single AC servomotor 400 is used in place of the differential gear system 186 and the first control motor 200. More specifically, an output gear 402 is mounted on the output shaft of the servomotor 400 and is meshed with a transmission gear 404, which is mounted on the aforesaid first sleeve shaft 154. Thus, in the second embodiment, the servomotor 400 is driven at the same time that the lower drum 28 is rotated, whereby the work head 70 is turned, as in the case of the first embodiment, and the suction nozzle 78 makes cycloid motion. The servomotor 400 is fixedly supported by the movable support 151 of the head unit 68, though not illustrated in detail.

Figure 14:
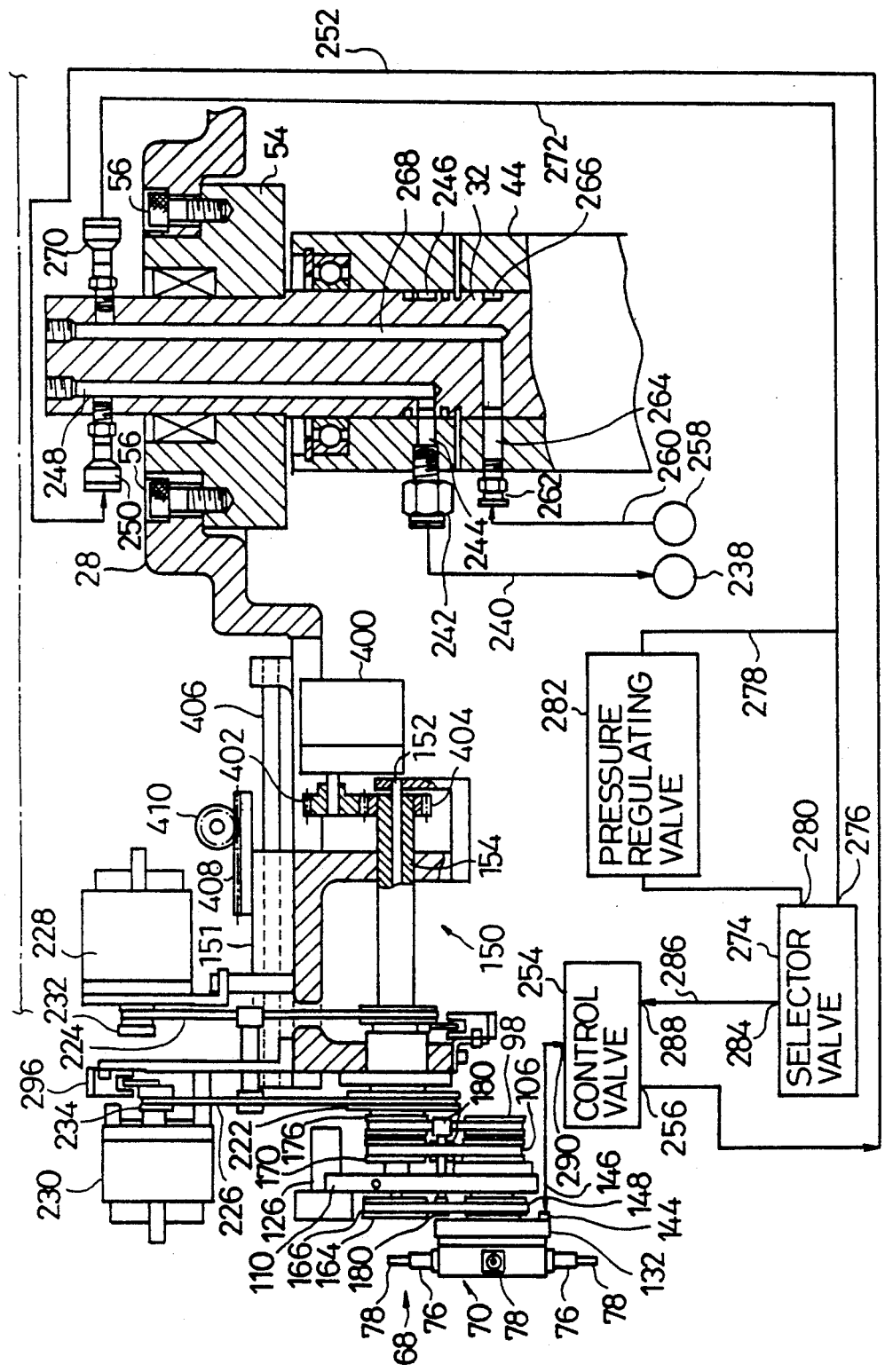
FIG. 14 is a sectional view showing part of a chip mounter according to a second embodiment of the invention.
Figure 15:
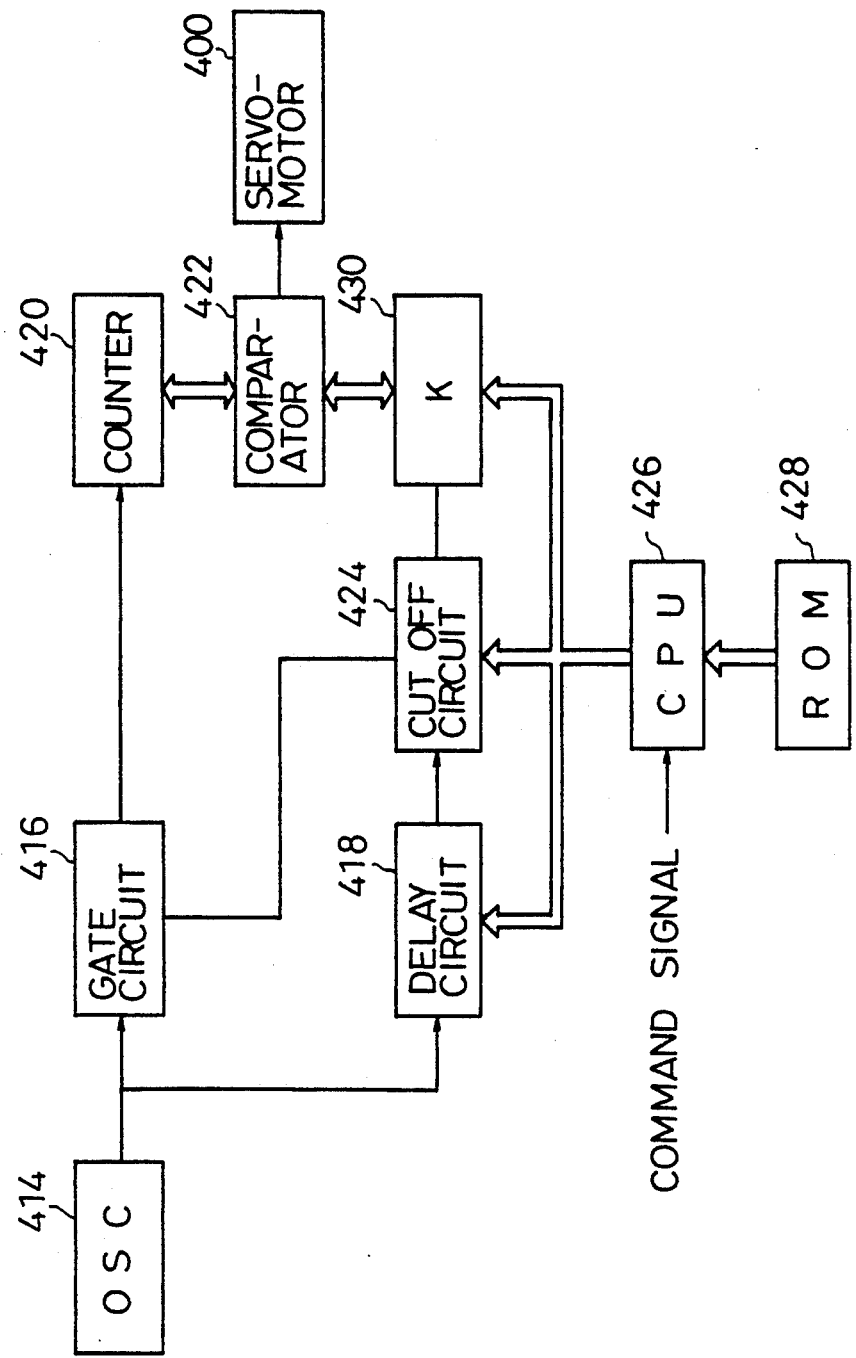
FIG. 15 is a block diagram showing a control unit of the chip mounter of FIG. 14.

FIG. 14 specifically shows an actuating mechanism for the head unit 68, which is not shown in FIG. 3. The actuating mechanism comprises a guide rail 406 extending in the radial direction of the lower drum 28 and mounted to the drum. The movable support 151 is slidably mounted on the guide rail 406.

A rack 408, which also extends in the radial direction of the lower drum 28, is fixedly mounted to the movable support 151 and is meshed with a pinion 410. The pinion 410 is connected to the output shaft of an electric motor (not shown) which is fixed to the lower drum 28. Thus, as the electric motor is driven, the head unit 68, i.e., the work head 70, is moved in the radial direction of the lower drum 28 by means of the rack-pinion assembly.

To mount the work W in a predetermined mounting position on the printed board B by using the servomotor 400, drive control for the servomotor 400 must be executed when the work head 70 is revolved to a position just short of the printed board B. The drive control for the servomotor 400 is executed, e.g., by a control unit shown in FIG. 15.

The control unit comprises an oscillator 412, which outputs a predetermined pulse signal corresponding to the rotational speed of the lower drum 28 to a gate circuit 416 and a delay circuit 418. The gate circuit 416 is connected to a comparator 422 via a counter 420, and the comparator 422 is connected to the servomotor 400.

The delay circuit 418 is connected to a cutoff circuit 424 which is connected to the gate circuit 416.

The delay circuit 418 and the cutoff circuit 424 are connected to a central processing unit (CPU) 426.

The CPU 426 is connected to a nonvolatile memory or ROM 428, in which predetermined data for controlling the servomotor 400 is previously stored in the form of a map, corresponding to individual mounting positions for the work W.

Figures 16, 17:
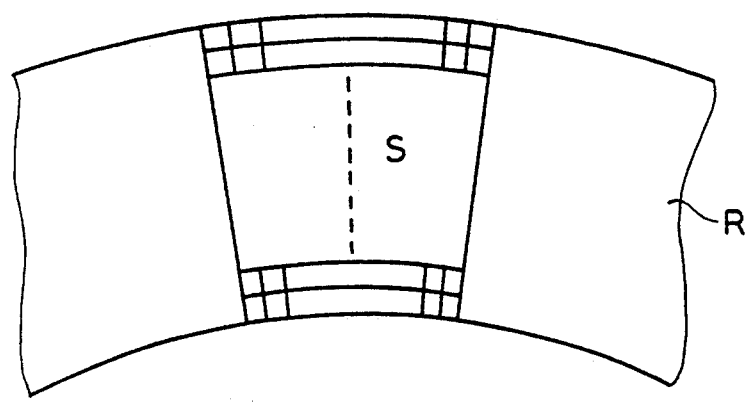
FIG. 16 is a diagram showing a work mounting surface subdivided into a plurality of mounting positions.
FIG. 17 is a diagram showing mapped data stored in a ROM of the control unit.

Namely, in the case where a mounting surface S on which the work W is to be mounted is subdivided into a plurality of mounting positions as shown in FIG. 16, a plurality of sets of data D for controlling the servomotor 400, which correspond to the respective mounting positions, are stored in the ROM 428 in the form of a map, as shown in FIG. 17. The data D for the individual mounting positions includes a required turning speed of the work head 70 or the suction nozzle 78a, a position at which the nozzle 78a is descended to its lowest level, etc. In this embodiment, the data D further includes pulse data K determining the rotational speed of the servomotor 400, and time data T determining the time at which the rotation of the servomotor 400 is stopped.

Upon receiving a command signal, the CPU 426 reads out the data D corresponding to the mounting position for the work W from the ROM 428, and supplies the time data T and the pulse data K, contained in the data D, to the cutoff circuit 424 and a setting circuit 430, respectively.

The control unit is started for operation by a command signal supplied to the CPU 426 when the work head 70 reaches a position just short of the printed board B. Specifically, upon start of the operation, the oscillator 414 starts supplying the pulse signal to the counter 420 through the gate circuit 416. The counter 420 then starts counting the pulses, and at the same time, supplies the count value to the comparator 422. The comparator 422 is also supplied with the pulse data K corresponding to the mounting position from the setting circuit 430. Thus, the comparator 422 compares the count value with the value of the pulse data K, and when the two values coincide, supplies a drive pulse to the servomotor 400. At this time, the value of the counter 420 is cleared. As a result, the rotational speed of the servomotor 400 is controlled in accordance with the drive pulse signal which is based on the pulse data K, and thus the work head 70 is turned by the servomotor 400 at a required turning speed corresponding to the mounting position.

Since the pulse signal from the oscillator 414 is also supplied to the delay circuit 418, the delay circuit 418 outputs an actuating signal to the cutoff circuit 424 when a predetermined time has elapsed after the output of the command signal. Upon receiving the actuating signal, the cutoff circuit 424 outputs a close signal to the gate circuit 416, whereby the gate of the circuit 416 is closed at this point of time. Thus, the pulse signal being supplied to the counter 420 is cut off, and accordingly, no drive pulse signal is supplied to the servomotor 400, and the rotation of the servomotor 400, i.e., the turning motion of the work head 70, is stopped.

The time period for which the gate of the circuit 416 is closed is determined by the time data T supplied from the CPU 426 to the cutoff circuit 424, and when the period determined by the time data T has elapsed, the gate of the circuit 416 is reopened.

After this, therefore, the work head 70 is turned by the servomotor 400 at a speed corresponding to the mounting position.

Figure 18:
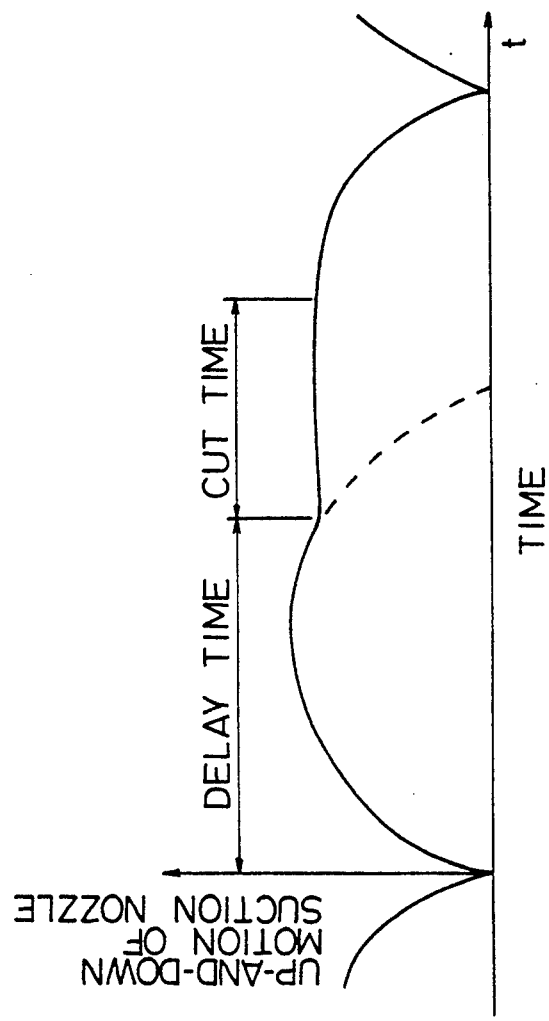
FIG. 18 is a graph showing a time-based change of the up-and-down motion of the suction nozzle.

When the rotational speed of the servomotor 400 is controlled in this manner, the cycloid motion of the suction nozzle 78 of the work head 70 is varied as shown in FIG. 18.

By changing the cycloid motion of the suction nozzle 78 in this manner, the nozzle 78a can be positioned at its lowest level at any point on the mounting surface S, and at the same time, the ground speed of the nozzle 78a, i.e., the speed of the nozzle relative to the printed board B, can be made zero at that point, whereby the mounting of the work W can be reliably carried out. Thus, also in the second embodiment, the work W can be mounted to any desired position on the printed board B without the need to actuate the XY-table 8, as in the first embodiment.

Figure 19:
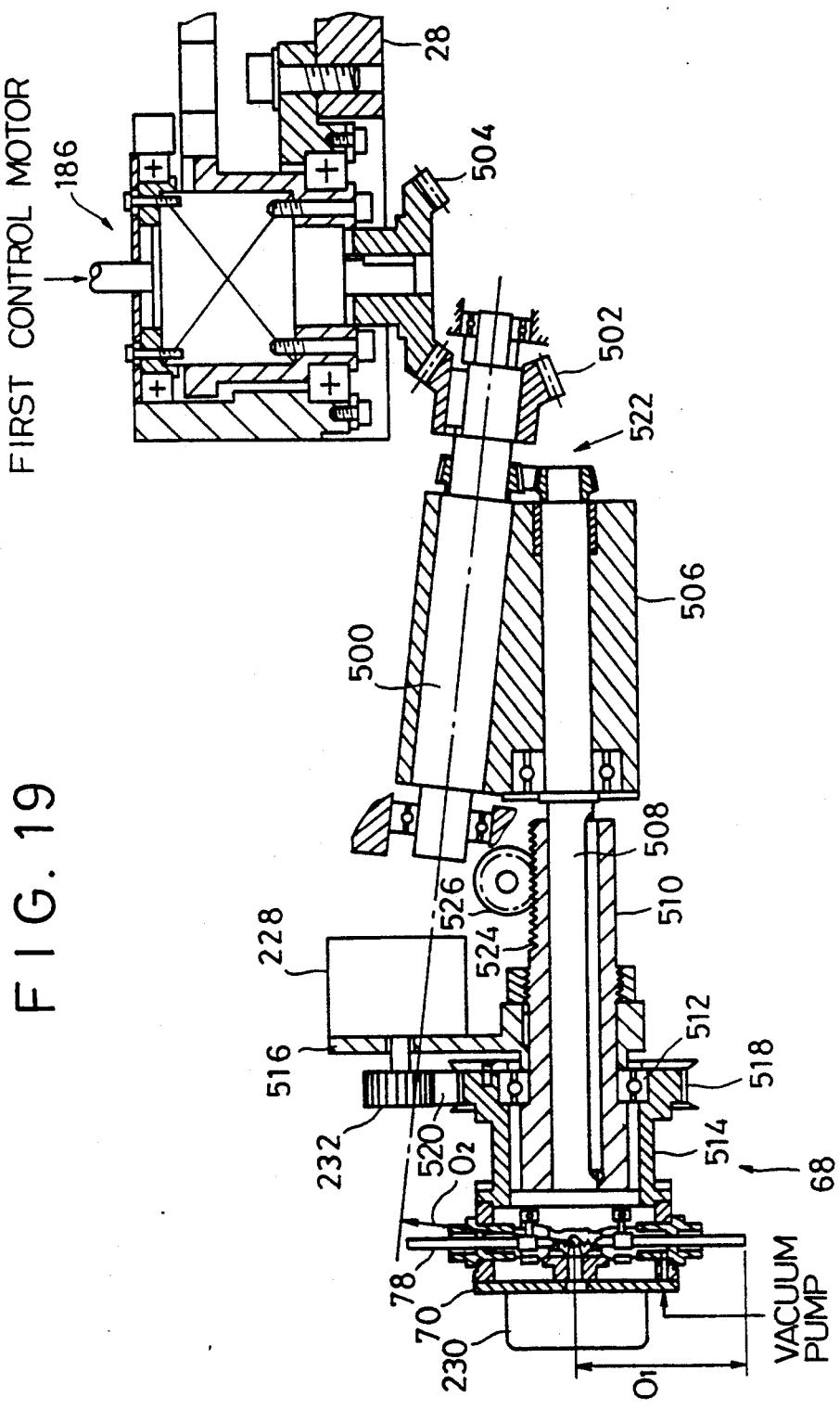
FIG. 19 is a sectional view showing part of a chip mounter according to a third embodiment of the invention.
Figure 20:
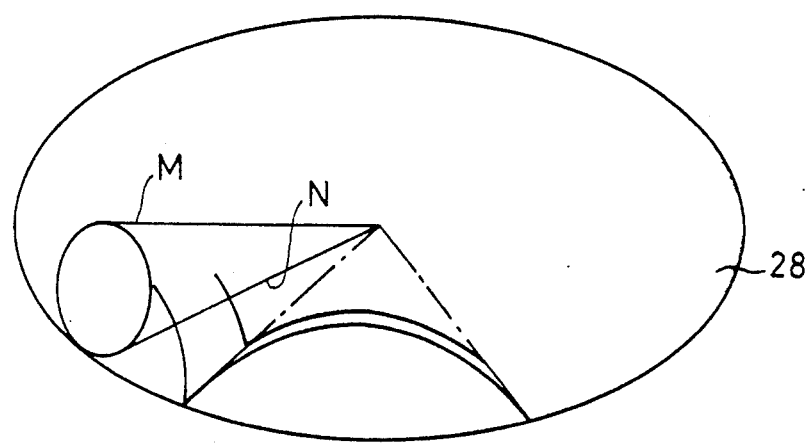
FIG. 20 is a diagram showing a change in the radius of the turning motion of the work head along the outer surface of a cone with movement of the work head.

Referring now to FIGS. 19 and 20, there is illustrated a chip mounter according to a third embodiment of the present invention. In both the chip mounters of the first and second embodiments described above, when the work W is mounted the cycloid motion of the suction nozzle 78a is distorted, but in the third embodiment, the work W can be mounted in any desired position on the printed board B while maintaining the cycloid motion of the nozzle 78a.

More specifically, the chip mounter of the third embodiment comprises a turning shaft 500 around which the work head 70 is turned and which is rotatably supported on the lower drum 28. As seen from FIG. 19, the turning shaft 500 is inclined with respect to the horizontal plane such that an outer end thereof, when taken in the radial direction of the lower drum 28, is raised. A bevel gear 502 is mounted on an inner end portion of the turning shaft 500 and meshed with another bevel gear 504. The bevel gear 504 is mounted on the output shaft of the differential gear system 186.

Thus, the turning shaft 500 is rotated by the driving force of the differential gear system 186, i.e., the first control motor 200.

An arm bracket 506 is fixed to the turning shaft 500, and a supporting shaft 508 is rotatably supported by the arm bracket 506. The supporting shaft 508 extends horizontally through the arm bracket 506, and a movable sleeve 510 is rotatably mounted on a distal end portion of the supporting shaft 508. An outer sleeve shaft 514 is rotatably supported on the movable sleeve 510 via a bearing 512. The work head 70 is mounted on one end of the outer sleeve shaft 514.

A bracket 516 is mounted on the movable sleeve 510 adjacently to the other end of the outer sleeve 514, and the second control motor 228 is mounted to the bracket 516. Thus, in this embodiment, the toothed pulley 232 of the second control motor 228 is connected to a toothed pulley 518, which is formed at the other end of the sleeve 514, by means of a toothed belt 520.

Further, the turning shaft 500 and the supporting shaft 508 are connected to each other by a planetary gear train 522. The planetary gear train 522 has a function of keeping the work head 70 in a fixed turning posture while the supporting shaft 508, and thus the work head 70, is turned through the arm bracket 506 as the turning shaft 500 rotates.

A rack portion 524 is formed in part of the outer peripheral surface of the movable sleeve 510, and a pinion 526 is in mesh with the rack portion 524. The pinion 526 is mounted on the output shaft of an electric motor (not shown), and thus, when the motor is driven, the work head 70 is moved in the radial direction of the lower drum 28. The motor is supported on the arm bracket 506.

In the chip mounter of the third embodiment, when the work head 70 is moved in the radial direction of the lower drum 28 as mentioned above, the radius of the revolution of the work head 70 or the suction nozzle 78 changes, as in the case of the first and second embodiments. At this time, since the radius of revolution of the suction nozzle 78 changes along the generatrix N of a cone M shown in FIG. 20, the turning speed thereof also changes concurrently.

Thus, if the angle of inclination of the turning shaft 500 is properly set, the speed of the suction nozzle 78a relative to that of the mounting position never fails to become zero at the time of mounting the work W even when the work head 70 is moved in the radial direction of the lower drum 28 in accordance with the mounting position of the work W.

When the work head 70 is moved, moreover, the cycle of the cycloid motion of the suction nozzle 78a changes concurrently. Therefore, by suitably controlling the movement of the work head 70, the mounting position of the work W can be shifted in the circumferential direction of the lower drum 28.

In the case of the third embodiment, the work head 70 makes a turning motion in a plane inclined with respect to the horizontal plane, and therefore, the suction nozzle 78 mounts the work W while descending obliquely with respect to the printed board B. However, if an adjusting mechanism is provided for making a distance 01 (FIG. 19) between the center of the work head 70 and the distal end of each suction nozzle 78 always equal to the length 02 of a perpendicular line connecting the center of the work head 70 and the axis of the turning shaft 500, then the distal end of the nozzle 78a makes an up-and-down motion in the vertical plane during the turn of the work head 70.

For such an adjusting mechanism, a mechanism may be used by which each suction nozzle 78 can be projected from and retracted into the work head 70.

What is claimed is:

1. A work mounting apparatus comprising:

a work supply section disposed in a predetermined transportation path and having a supply position to which works are successively supplied;

a work mounting section disposed at a distance from the supply section, in the transportation path, and having a mounting surface upon which the works are to be mounted by the work mounting apparatus;

a carrier repeatedly movable along the transportation path between the mounting section and the supply section;

a work head provided on the carrier, the work head having a turning axis extending across the transportation path and including an attraction rod projecting from the work head toward the transportation path said attraction rod having a distal end, wherein said work head and turning axis move with said carrier as said carrier moves along said transportation path;

turning means for turning the work head around the turning axis while keeping the work head in a fixed posture such that the work head maintains a predetermined orientation with respect to the transportation path, with the turning means turning the work head during the movement of the carrier such that the turning means turns the work head about the turning axis while said turning axis also moves as said carrier moves along said transportation path, and thereby moving the distal end of the attraction rod in a cycloid motion with respect to the transportation path;

means for supplying an attraction force to the rod;

control means for controlling a cycle of the cycloid motion of the distal end of the attraction rod and for controlling said means for supplying an attraction force to the rod such that the control means causes one of the works to be attracted to the distal end of the rod in the supply position and then releases the work from the distal end of the rod at the mounting surface, so that the work is mounted on the mounting surface; and actuating means for moving the work head in a direction across the transportation path.

2. The work mounting apparatus according to claim 1, wherein said transportation path is circular in shape within a horizontal plane, and said carrier includes a rotating drum of which the outer periphery rotates over and along the transportation path.

3. The work mounting apparatus according to claim 2, wherein said work head includes a turning shaft extending in the radial direction of the rotating drum and defining the turning axis thereof; said turning means includes a power transmission path for transmitting a rotatory force of the rotating drum to the turning shaft to thereby rotate the turning shaft, and a planetary mechanism for connecting the turning shaft and the work head and turning the work head while keeping the work head in said fixed posture; and said control means includes a harmonic drive disposed in the middle of the power transmission path, the harmonic drive receiving at least one of inputs including a rotation input from the rotating drum and a control input, and supplying a controlled rotation output to the turning shaft.

4. The work mounting apparatus according to claim 3, wherein said control means includes speed change means disposed in the power transmission path on a lower-course side of the harmonic drive, the speed change means transmitting a rotation output of the harmonic drive to the turning shaft after subjecting the rotation output to speed change.

5. The work mounting apparatus according to claim 4, wherein said power transmission path includes a pair of separate power transmission shafts disposed between the turning shaft and the harmonic drive, the power transmission shafts having end faces facing each other; and said speed change means includes a disk coupled to one of the pair of separate power transmission shafts, said disk having an end face facing toward the other of the pair of separate power transmission shafts, said disk also having a guide groove formed in the end face thereof and extending in the radial direction thereof, a roller shaft protruding from the end face of the other of the power transmission shafts eccentrically with respect thereto, a roller mounted to the roller shaft and fitted in the guide groove, and means for adjusting a distance of eccentricity between axes of said pair of power transmission shafts.

6. The work mounting apparatus according to claim 5, wherein said actuating means includes a guide rail provided on the rotating drum and extending in the radial direction of the rotating drum, and a movable support movable on the guide rail, the turning shaft being rotatably supported by the movable support.

7. The work mounting apparatus according to claim 2, wherein said work head includes a turning shaft extending in a radial direction of the rotating drum and defining the turning axis thereof; said turning means includes a servomotor for rotating the turning shaft, and a planetary mechanism for connecting the turning shaft and the work head and turning the work head while keeping the work head in a fixed posture; and said control means includes a control circuit for controlling the rotational speed of the servomotor, the control circuit including means for correcting the speed and cycle of the cycloid motion of the attraction rod in accordance with the mounting position of the work on the mounting surface.

8. The work mounting apparatus according to claim 7, wherein said actuating means includes a guide rail provided on the rotating drum and extending in the radial direction of the rotating drum, and a movable support movable on the guide rail, the turning shaft being rotatably supported by the movable support.

9. The work mounting apparatus according to claim 2, wherein said work head includes a turning shaft extending in a radial direction of the rotating drum and defining the turning axis of thereof, the turning shaft being inclined with respect to a horizontal plane; said turning means includes a drive source for rotating the turning shaft, a supporting shaft supporting the work head and turned around the turning shaft along a conical surface as the turning shaft rotates, and a planetary mechanism connecting the supporting shaft and the turning shaft and keeping the work head in said fixed posture.

10. The work mounting apparatus according to claim 9, wherein said actuating means includes a sleeve shaft supporting the work head and slidable on the supporting shaft, and a rack-pinion assembly for moving the sleeve shaft along the supporting shaft.

11. The work mounting apparatus of claim 1, wherein said carrier moves about a carrier axis, and wherein said turning axis extends radially with respect to said carrier axis such that said turning means turns said work head around said turning axis to move said distal end in said cycloid motion as said carrier moves about said carrier axis.

12. The work mounting apparatus of claim 11, wherein said carrier includes an outer periphery which rotates about said carrier axis, and wherein said carrier axis is vertical.

* * * * *